United States Patent [19]
Miyake et al.

[11] Patent Number: 5,669,548
[45] Date of Patent: Sep. 23, 1997

[54] SOLDERING METHOD

[75] Inventors: Toshihiro Miyake, Inuyama; Koji Kondo, Toyohashi; Takashi Kurahashi, Okazaki; Nozomu Okumura, Nagoya; Makoto Takagi, Okazaki, all of Japan

[73] Assignee: Nippondenso Co., Ltd., Kariya, Japan

[21] Appl. No.: 620,212

[22] Filed: Mar. 22, 1996

[30] Foreign Application Priority Data

Mar. 24, 1995 [JP] Japan .................. 7-091862
Dec. 18, 1995 [JP] Japan .................. 7-348710

[51] Int. Cl.⁶ .......................... H05K 3/34; B23K 35/363
[52] U.S. Cl. .................. 228/224; 228/205; 228/180.22
[58] Field of Search .................. 228/180.21, 180.22, 228/205, 207, 223, 224

[56] References Cited

U.S. PATENT DOCUMENTS

| | | | |
|---|---|---|---|
| 4,165,244 | 8/1979 | Jacobs | 148/23 |
| 5,477,086 | 12/1995 | Rostoker et al. | 257/737 |
| 5,558,271 | 9/1996 | Rostoker et al. | 228/180.22 |

FOREIGN PATENT DOCUMENTS

| | | |
|---|---|---|
| 60-187465 | 9/1985 | Japan . |
| 1-157767 | 6/1989 | Japan . |
| 3-207569 | 9/1991 | Japan . |
| 6-226485 | 8/1994 | Japan . |
| 7-088687 | 4/1995 | Japan . |
| 7-108397 | 4/1995 | Japan . |

*Primary Examiner*—Samuel M. Heinrich
*Attorney, Agent, or Firm*—Cushman, Darby & Cushman, IP Group of Pillsbury Madison & Sutro LLP

[57] ABSTRACT

A soldering method, which secures reliable joints without using flux, is disclosed. Soldering is performed using an auxiliary connecting material capable of physically destroying and dispersing an oxide film, which is naturally grown on the surface of a main connecting material such as solder or brazing between two terminals, to realize a reliable solder wetting (a state of the main connecting material being fused and mixed). For an auxiliary connecting material, hydrocarbon such as n-tetradecane ($C_{14}H_{30}$), for example, can be used. N-tetradecane boils between connection surfaces and cubically expands; energy generated therefrom physically disperses the oxide film and causes a fresh surface to be exposed; solders on both terminals are mixed; and an electrical and mechanical joint is securely achieved. The residue of the auxiliary connecting material is an insulating material, and therefore does not need cleaning. An excellent electrical joint which is moisture-resistant as well as highly reliable is attained.

10 Claims, 6 Drawing Sheets

BOILING
EVAPORATING

SOLDERING METHOD

CROSS REFERENCE TO RELATED APPLICATION

This application is based upon and claims the benefit of priority of the prior Japanese Patent Applications No. 7-91862 filed on Mar. 24, 1995 and No. 7-348710 filed on Dec. 18, 1995, the contents of which are incorporated herein by reference.

BACKGROUND OF THE INVENTION

1. Field of the Invention

The present invention relates to a soldering method. More specifically, the present invention relates to a method of electrically and mechanically connecting a substrate such as a rigid substrate and a flexible substrate, or a method of electrically and mechanically mounting on a substrate a connected member such as an IC (integrated circuit) chip, a discrete element and so on.

2. Related Arts

In recent years, there have been growing demands, in the installation of electronic products, for techniques of connecting and mounting components which are to be put in place at microscopic intervals. In the past, flux has been used in the soldering (which hereinafter implies an electrical connection by means of soldering and brazing). The flux has to be removed by cleaning after a connecting operation is finished since it is corrosive. In view of the environmental problems, however, there has been increasing restrictions imposed on the use of cleaning agents which contain CFCs (chlorofluorocarbons). A cleaning operation is sometimes difficult to be performed in the case of a soldering operation which has to be executed inside a package. Consequently, attempts have been made to implement soldering operations dispensing with cleaning operations by using low active flux which does not require the cleaning operation, or to perform a soldering operation in an inactive atmosphere without using flux if it has to be executed in a location which does not allow a cleaning operation. In the cases like these where low active flux is used or soldering operations are performed without using flux, it is difficult to secure a sufficient area for connection due to the effect of an oxide film on the surface of solder, which has given rise to such problems as the soldering being insufficient in strength and the connection being low in reliability, or voids occurring inside solder.

As an example of a soldering which will solve such problems as mentioned above, there is disclosed in Japanese Patent Laid Open No. 6-226485 a method in which a soldering is performed with a solder alloy coated with paraffin wax on its surface. Paying attention to the fact that the voids are caused by an oxide film, the technique has employed a method of covering solder with paraffin wax so as to prevent an oxide film from being grown on the surface of the solder.

Although the above-mentioned technique shows a method for preventing an oxide film from being formed, and for keeping and using solder under a condition in which there is no penetration of water, but it does not deal with soldering which has to be performed under a condition in which there is an oxide film formed on solder. In other words, soldering cannot be executed unless terminals have been solder-plated in advance as in the case of connections between terminals, and in the event of solder surface being oxidized, solder coated with paraffine wax cannot be used for connections between terminals.

SUMMARY OF THE INVENTION

It is an object of the present invention to provide a method of connecting or mounting a base member and a connected member, which can secure for them a reliable connection and an excellent insulation.

To solve the above-mentioned problems, a soldering method, which comprises a step of disposing a main connecting material composed of a soldering or brazing material and an auxiliary connecting material of an insulating material between a base member and a connected member; and a step of heat treating the main connecting material to be fused while at the same time causing the auxiliary connecting material to be cubically expanded or vaporized, can be employed. According to this, the auxiliary connecting material is subjected to cubical expansion or vaporization during the heat treating, the cubical expansion or vaporization of the auxiliary connecting material causes an oxide film grown on the surface of the main connecting material to be destroyed, and thus the base member and the connected member are electrically and mechanically joined through the main connecting material.

Accordingly, unlike flux, the auxiliary connecting material physically disperses the oxide film on the surface of the main connecting material without chemically dissolving it, which makes it possible for the base member and the connected member to be electrically and mechanically joined securely. Herein, in case the auxiliary connecting material comprises an insulating material having no functional group, the insulation quality thereof is prevented from deteriorating after the soldering operation, and thus it will not cause the insulation quality around an electrode joint to be reduced even if it is left in the periphery of the joint.

The main connecting material may be coated on at least one of connection surfaces of either the base member or the connected member. In this case, as the auxiliary connecting material, a material capable of vaporizing around at the melting point of the main connecting material may be selected to cause the auxiliary connecting material to be vaporized during the heat treating step. By means of this, the oxide film can be destroyed during the heat treating step to electrically and mechanically connect the base member and the connected member with high reliability, and the auxiliary connecting material can be vaporized away after soldering as well.

Also, as the auxiliary connecting material, a material mainly composed of such material whose boiling point is greater than the melting point of the main connecting material and whose vapor pressure is $1/100$ or over of the external pressure at a maximum temperature during the heat treating step may be selected to cause the auxiliary connecting material to be cubically expanded during the heat treating step. By means of this, the auxiliary connecting material existing around the joint portion will get into a boiling condition, undergoing an abrupt cubical expansion. The energy generated by this cubical expansion will physically disperse and destroy the oxide film which is staying as formed without being dissolved on the surface of the main connecting material, thereby causing the non-oxidized section to be exposed to electrically and mechanically connect the base member and the connected member with high reliability.

Furthermore, it may be possible for the main connecting material and the auxiliary connecting material to be kneaded and formed into a paste-like condition to be applied to the joint portion between the base member and the connected member. Besides enabling the base member and the connected member to be electrically and mechanically connected in a good condition, the formed paste also allows the base member and the connected member to be fixed tentatively through the paste, which makes it easier for them to be mounted.

Furthermore, the use of hydrocarbon for the auxiliary connecting material may fully vaporize the auxiliary connecting material at a temperature that the main connecting material is fused. More preferably, the hydrocarbon must be alkane, alkene or alkyne.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS (First Embodiment)

A description shall be given below of this invention with reference to several embodiments thereof.

Figure 1A:
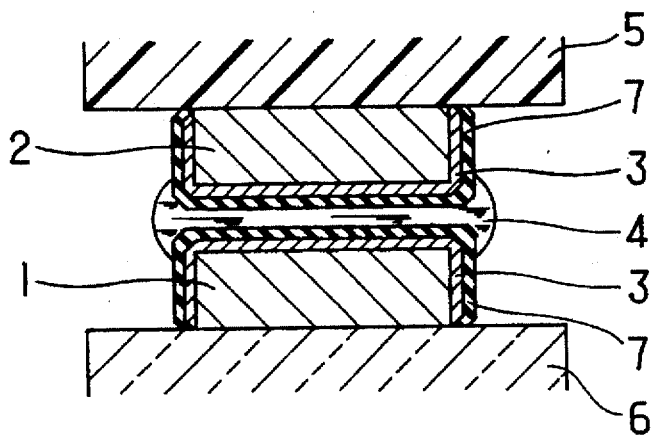
FIGS. 1A, 1B and 1C are explanatory views showing the soldering method according to a first embodiment in which an auxiliary connecting material is applied to the surface of a plated solder.
Figure 1B:
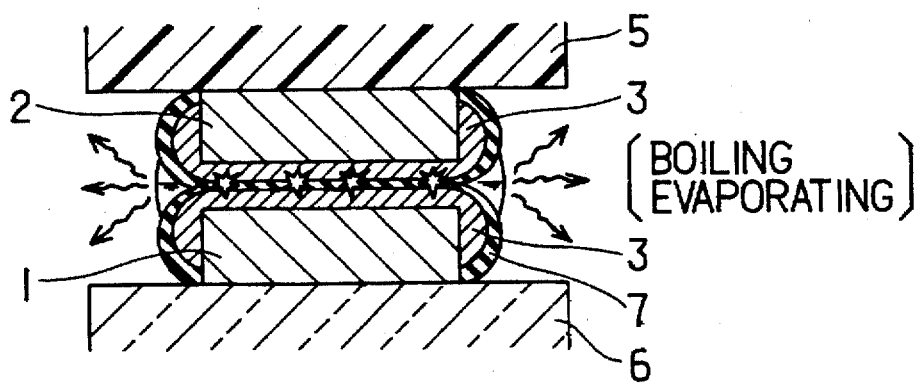
Figure 1C:
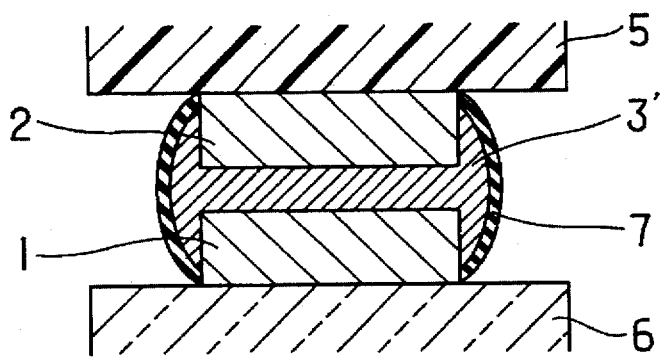
Figure 2:
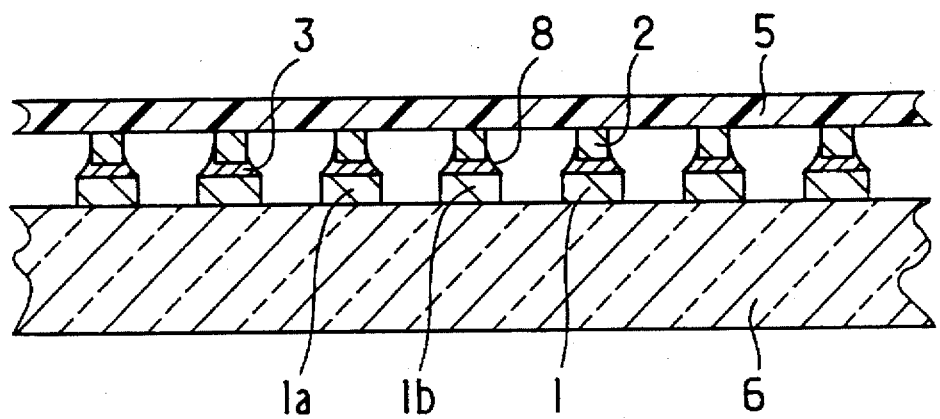
FIG. 2 is a schematic sectional view showing the array of connecting terminals of the first embodiment.

FIGS. 1A to 1C are typical explanatory drawings showing the cases in sequential order in which a copper terminal (the first connection surface) 1 which is formed on a rigid substrate 6 made of glass or glass epoxy and a copper terminal (the second connection surface) 2 which is provided on a flexible substrate (a connected member) 5 made of plastic film are connected by means of soldering. FIG. 2 is a schematic sectional view showing a disposition of the copper terminals 1 and 2.

In FIG. 1A, solder (main connecting material) 3 has been applied beforehand on the surfaces of each copper terminal 1 and 2, and the surface of the solder 3 is covered with an oxide film 7 before being connected. FIG. 1A shows the copper terminals 1 and 2 in that condition placed one on top of the other so as to be connected. Before placing the terminals one upon the other, an auxiliary connecting material 4 characteristic of this invention must be applied on the surface of the solder 3 between the connection surfaces in the manner described later. The auxiliary connecting material 4 may also be applied to the sides of the copper terminals 1 and 2, not being limited to the condition as shown in FIG. 1A.

The auxiliary connecting material 4 used here is n-tetradecane ($C_{14}H_{30}$), a kind of hydrocarbon. The auxiliary connecting material 4 is an insulating material in a liquid state at room temperature. If contained between the terminals as stated above, it will not cause trouble such as corrosion, since it is a non-reactive material. It has a moisture-resistant quality preventing the external moisture. The solder 3 is made of eutectic solder which is composed of 60 wt % of tin (Sn) and 40 wt % of lead (Pb). Described below is a method of the soldering.

(1) The surfaces of the copper terminal 1 on the rigid substrate 6 and the copper terminal 2 on the flexible substrate 5 are coated with the solder 3 of a thickness of approximately 1 to 20 μm by means of plating. Then, the surface of the solder 3 is applied with n-tetradecane ($C_{14}H_{30}$) by means of brushing.

(2) Then, as shown in FIG. 1A, the substrates 5 and 6 to be connected are put in place, and the copper terminals 1 and 2 solder-plated and coated with the auxiliary connecting material 4 are placed one upon the other facing each other. Heat is applied from above the flexible substrate 5 by means of a heater bar (not shown). When the soldering temperature has risen up to a degree higher than the melting point of 290° C., the solder 3 is fused to connect the copper terminal 1 with the copper terminal 2. On this occasion, the substrates 5 and 6 are pressurized at 2 to 40 kg/cm$^2$ so that the copper terminals 1 and 2 will not be displaced.

(3) n-tetradecane ($C_{14}H_{30}$) boils at a temperature of 252° C. at which the solder 3 is fusing. As a result, the n-tetradecane ($C_{14}H_{30}$) which is caught in molten solder 3 between the copper terminals 1 and 2 abruptly develops into a cubical expansion. As shown in FIG. 1B, this abrupt cubical expansion acts on the molten solder 3 to physically destroy the oxide film 7 on the solder 3 existing on the surface thereof. By this process, the molten solders provided on the surfaces of both the copper terminals 1 and 2 are mixed to connect them electrically, being soldered mechanically at a desired strength. As shown in FIG. 1C, since the joint is effected by means of soldering with the oxide film 7 (see FIG. 1A) existing in the space between the copper terminals 1 and 2 destroyed, it has a high reliability of connection. Obviously, the oxide film 7 at the sides of the copper terminals 1 and 2 remains after they are connected together.

(4) Also, a greater part of the n-tetradecane ($C_{14}H_{30}$) remains as residue, after being soldered (not shown), on the surfaces of the copper terminals 1 and 2, and of the solder 3, as well as on the surfaces of the rigid substrate 6 and the flexible substrate 5, which exist between a plurality of the copper terminals 1 and 2. Since the n-tetradecane ($C_{14}H_{30}$) does not contain functional groups such as carboxyl group, hydroxyl group and amino group, it does not corrode the copper terminals 1 and 2 as well as the solder 3 even under high temperature and high humidity. Therefore, it is not necessary to execute a cleaning, after soldering, to remove this auxiliary connecting material 4. Furthermore, the residue is effective as a passivation film to prevent the penetration of moisture from the surface of the solder 3 into the copper terminals 1 and 2, thus giving the joint a high reliability for a long period of time.

Figure 3A:
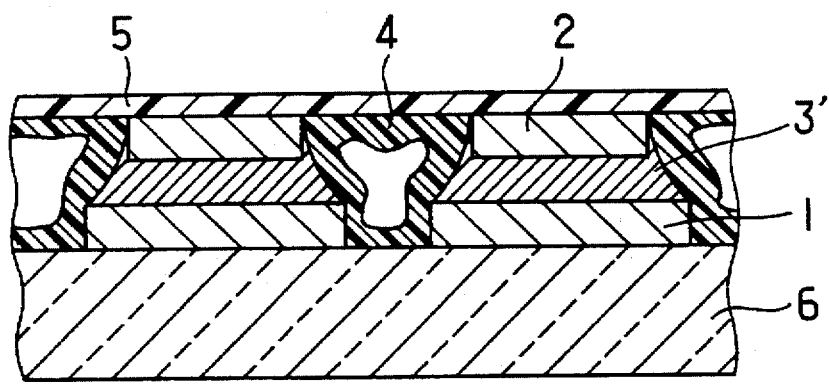
FIGS. 3A and 3B are schematic sectional views showing the state of residue between connecting terminals.
Figure 3B:
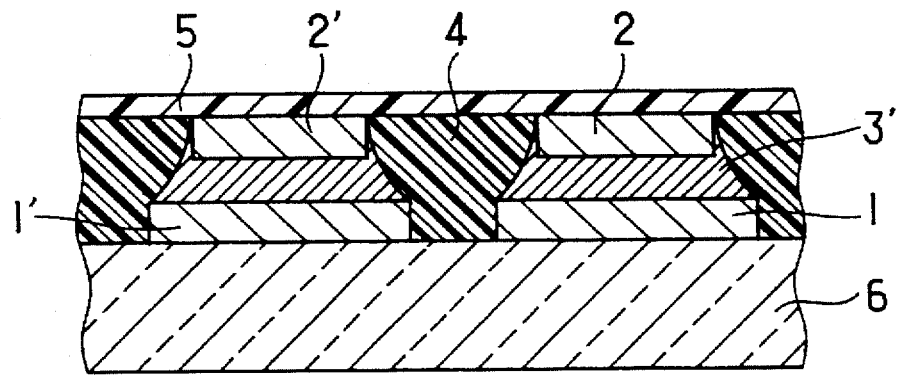

The sectional structures of the copper terminals 1 and 2 on the connected rigid substrate 6 and the flexible substrate 5 are shown in FIG. 2. As can be seen from FIG. 2, the width of the copper terminal 2 on the flexible substrate 5 is different from that of the copper terminal 1 on the rigid substrate 6. The width of the copper terminal 2 is narrower than that of the copper terminal 1. It is so structured that the copper terminal 2 is disposed within the width of the copper terminal 1, that solder fillet 8 is formed by means of soldering which extends from the copper terminal 2 having a smaller width toward copper terminal 1 having a larger width, and that the adjoining copper terminal 1a and 1b on the rigid substrate 6 do not come in contact with each other. FIGS. 3A and 3B show a further detailed state of the connection performed under this configuration using the auxiliary connecting material 4 of this invention.

FIG. 3A is a typical sectional view showing a state in which the auxiliary connecting material 4 remains as residue in the periphery of the connected copper terminal 1 and 2. FIG. 3B shows a state in which the auxiliary connecting material 4 remains filled up in the entire space between the connected copper terminal 1 and 2 and their adjoining copper terminal 1' and 2'. The auxiliary connecting material 4 remaining as residue is not only moisture-resistant. It also plays a role of protecting the periphery of the connection land of the copper terminal 1 and 2 from pollutant or corrosive substances, thereby enhancing durability.

The auxiliary connecting material 4 should meet the following two conditions.

First, the auxiliary connecting material 4 has a vapor pressure to vaporize that is enough for it to develop into cubical expansion at a temperature at which the main connecting material 3 is fused. As shown in the temperature-vapor pressure characteristic curve L1 in FIG. 4B, the boiling point T3 of the material should be over the melting point T1 of the main connecting material 3, and the vapor pressure of the material should be higher than the pressure P1, which is 1/100 of the external pressure (atmospheric pressure) P2, at a heated maximum working temperature T2 at which the main connecting material 3 such as solder is actually heated and fused. In other words, it is a desirable condition that the temperature-vapor pressure characteristic curve L1 passes through the hatched region (T1-T2-P2-P1) in FIG. 4B which is enclosed by the melting point T1, maximum working temperature T2, external pressure P2, and pressure P1 which is equivalent to 1/100 of the external pressure.

The heated maximum working temperature T3 of the main connecting material 3 means the maximum temperature reached by it while its temperature is going up or down with an elapse of time at a specified temperature gradient when it is heated and fused by means of such heating sources as a heater bar. Furthermore, since the main connecting material 3 and the auxiliary connecting material 4 are disposed at a close interval, their temperatures are almost identical. Usually, the heated maximum working temperature T2 of the main connecting material 3 varies according to materials which it is composed of. It is determined in terms of the mechanical strength and reliability of the main connecting material 3 after being connected. In the embodiment, it was set at 290° C.

Since the auxiliary connecting material 4 having the temperature-vapor pressure characteristic curve L1 which passes through the hatched region has a vapor pressure higher than 1/100 of the external pressure (atmospheric pressure) P2 at the heated maximum working temperature T2 at which it is actually heated and fused, it develops into an abrupt cubical expansion or boiling condition, which results in destroying the oxide film on the surface of the main connecting material 3 such as solder as was described earlier, thereby enabling a soldered joint.

On the contrary, those auxiliary connecting materials 4 of which the temperatures at the melting points T4 are lower than the melting point T1 of the main connecting material 3, in other words, those auxiliary connecting materials 4 of which vapor pressure characteristic curves have the temperature-vapor pressure characteristic curve L2 higher than the external pressure at the melting point T1 of the main connecting material 3, will have vaporized for the most part before they reach the heated maximum working temperature T2 when they are actually heated and fused, thus being not able to act so as to destroy the oxide film on the surface of the solder 3.

Also, those auxiliary connecting materials 4 of which the vapor pressures are lower than the pressure P1 which is equivalent to 1/100 of the external pressure P2, in other words, those which have the temperature-vapor pressure characteristic curve L3, will have vapor pressures lower than 1/100 of the external pressure (atmospheric pressure) P2 even at the time they reach the heated maximum working temperature T2 when they are actually heated and fused, thus being not able to act so as to destroy the oxide film on the surface of the solder 3.

Furthermore, for the auxiliary connecting material 4 being capable of developing forcefully into a cubical expansion at the heated maximum working temperature T2, it is desirable that they have vapor pressures higher than the pressure P3 which is equivalent to 1/10 of the external pressure in the atmosphere a soldering is performed.

Second condition is that the auxiliary connecting material 4 has an insulation quality free from functional groups.

If the auxiliary connecting material 4 contains functional groups such as carboxyl group, hydroxyl group and amino group, those functional groups will corrode the surfaces of the auxiliary connecting material 4, solder 3, and of the copper terminals 1 and 2, thereby reducing the reliability of the joint. Particularly, the residue of the auxiliary connecting material 4 containing functional groups is detrimental to securing joints of high reliability for a long period of time.

Furthermore, since the main connecting materials 3 for use in soldering such as solder and brazer have various melting points T1 and heated maximum working temperatures T2, it is required to select auxiliary connecting material 4 that has the temperature-vapor pressure characteristic curves suitable for respective cases.

A description shall be given below about several embodiments which satisfy the above-mentioned conditions, referring to FIG. 4A.

As the main connecting material 3, the eutectic solder in this embodiment has the melting point T1=183° C. and the heated maximum working temperature T2=290° C. A typical material that satisfies the above-mentioned conditions is hydrocarbon, and among alkanes ($CH_3(CH_2)_mCH_3$) that contain the n-tetradecane ($C_{14}H_{30}$) there are such as undecane ($C_{11}H_{24}$), icosane ($C_{20}H_{42}$) and triacontane ($C_{30}H_{62}$). The temperature-vapor pressure characteristic curves of those three items are shown in FIG. 4A.

Those three representative items are not chemically reactive and free from functional groups such as carbonyl group, hydroxyl group and amino group. They are insulating materials. By the way, in the temperature-vapor pressure characteristic curves, hydrocarbons which have the smaller molecular weights have the higher vapor pressures and melting points. In the figure, the temperature at the boiling point is indicated at the point of intersection of the horizontal line P2 for the pressure in general of 760 mmHg, an atmospheric pressure when a soldering operation is performed, and the temperature-vapor pressure characteristic curve.

Figure 4A:
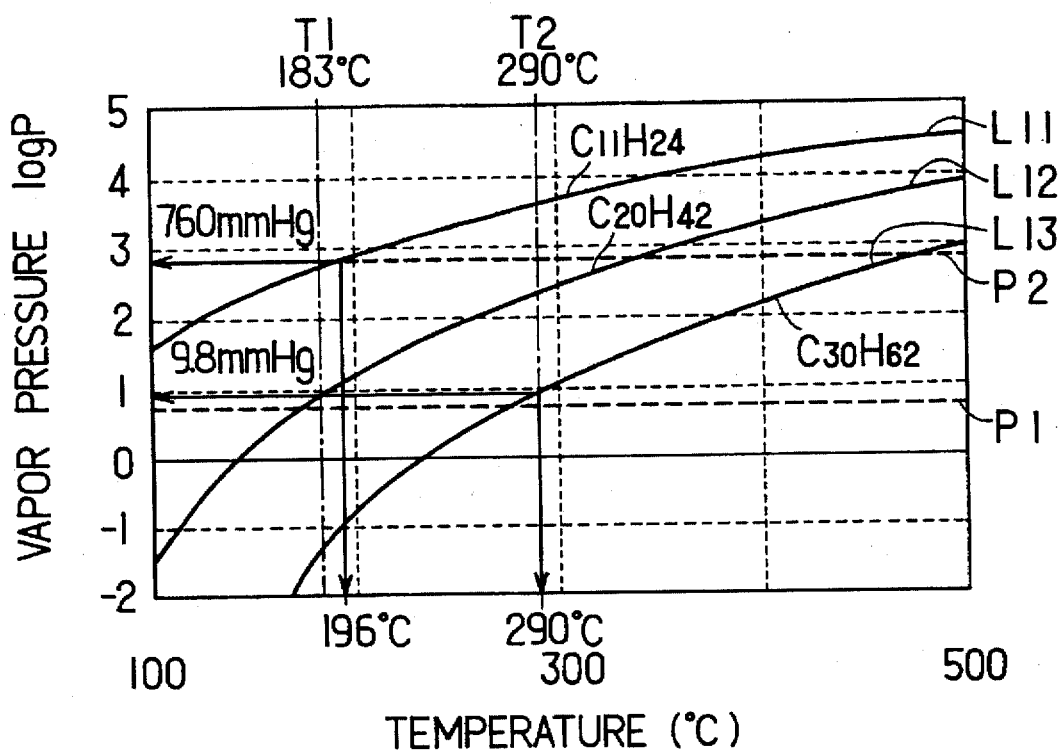
FIGS. 4A and 4B are graphs showing the temperature dependency of vapor pressure of alkanes.
Figure 4B:
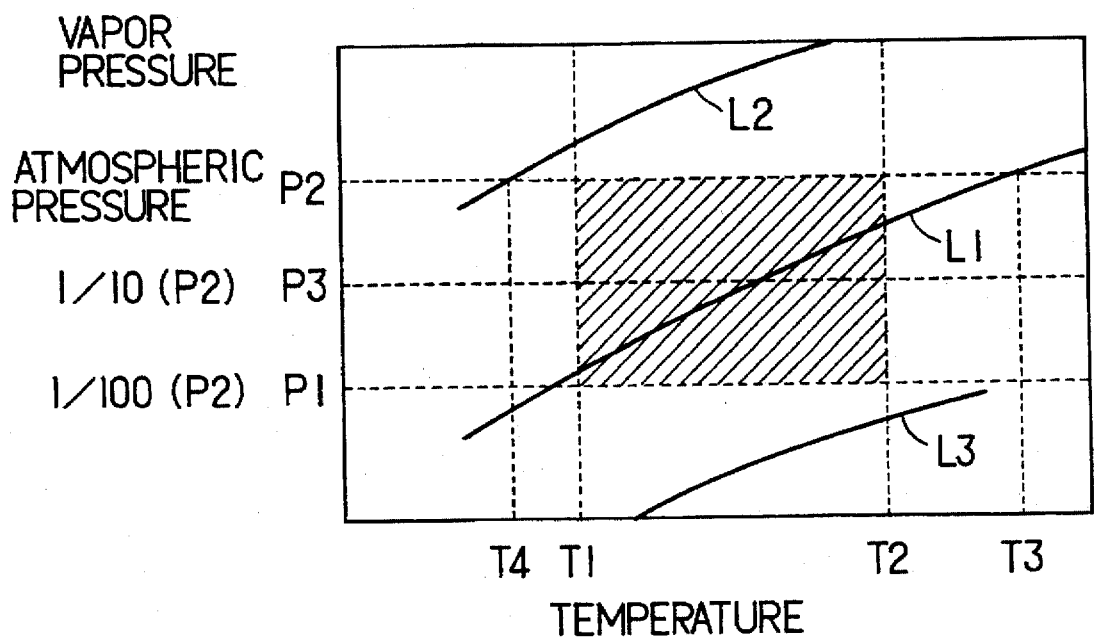

Additionally, there are alkanes ($CH_3(CH_2)_mCH_3$) of m=9 to 28 that can be used as the hydrocarbons that meet the above-mentioned conditions not shown in FIG. 4A. Specifically, there are undecane ($C_{11}H_{24}$), dodecane ($C_{12}H_{26}$), tridecane ($C_{13}H_{28}$), tetradecane ($C_{14}H_{30}$), pentadecane ($C_{15}H_{32}$), hexadecane ($C_{16}H_{34}$), heptadecane ($C_{17}H_{36}$), octadecane ($C_{18}H_{38}$), nanodecane ($C_{19}H_{40}$), icosane ($C_{20}H_{42}$), henicosane ($C_{21}H_{44}$), docosane ($C_{22}H_{46}$), tricosane ($C_{23}H_{48}$), tetracosane ($C_{24}H_{50}$), pentacosane ($C_{25}H_{52}$), hexacosane ($C_{26}H_{54}$), heptacosane ($C_{27}H_{56}$), octacosane ($C_{28}H_{58}$), nanocosane ($C_{29}H_{60}$) and triacontane ($C_{30}H_{62}$).

In the above-mentioned embodiment, the straight chain of n-tetradecane ($C_{14}H_{30}$) was illustrated for example. However, in addition to the materials mentioned above, substances having side chains of carbon-carbon linkage, alkenes having double bonds of carbon in the skeleton of hydrocarbon, alkynes having triple bonds, aromatic substances not having functional groups or cyclic hydrocarbons can also be used. Furthermore, in addition to hydrocarbons as organic substances, inorganic substances such as silicone oil may also be used.

Next, in order to examine the durability of the joints formed by using the method of this invention, a voltage of 65 V was applied between the connecting terminals adjoining side by side and not being cleaned, which were formed using n-tetradecane ($C_{14}H_{30}$) and icosane ($C_{20}H_{42}$), and they were left standing in an atmosphere of 65° C. and 95% RH to check the moisture-resistance thereof. For the sake of comparison, tests were also conducted on the samples which were connected using a rosin-line low active flux. As a result, it was found that the incidence of failure for the samples compared with was 100%, while that for the samples of this invention was 0%, when tested for a period of 500 hours.

Comparisons of the pulling-off strength were conducted by means of a tensile test on the joints formed by using eutectic solder with the materials listed in the Table 1 applied as auxiliary connecting materials. The tensile test was carried out by pulling the flexible substrate 5 in FIG. 1A upward with an end as a support. A tensile strength when the joint was pulled off was determined, and converted into the strength per width of 1 mm of the connection surface of the joint. For the sake of comparison, the joints which were identical in the contour but formed by using a conventional rosin-line low active flux were also included.

TABLE 1

| Auxiliary connecting material | Peeling-off strength (kg/mm) |
|---|---|
| Nil | 0.05 |
| Low active flux | 0.20 |
| Hexane ($C_6H_{14}$) | 0.08 |
| Undecane ($C_{11}H_{24}$) | 0.20 |
| Tetradecane ($C_{14}H_{30}$) | 0.22 |
| Icosane ($C_{20}H_{42}$) | 0.21 |
| Triacontane ($C_{30}H_{62}$) | 0.19 |
| Pentatriacontane ($C_{35}H_{72}$) | 0.09 |

As a result, it was found that four items of alkanes apart from hexane ($C_6H_{14}$) and pentatriacontane ($C_{35}H_{72}$) have tensile strengths equivalent to those of the conventional items. As shown in FIG. 4A, triacontane ($C_{30}H_{62}$) has a vapor pressure of approximately 9.8 mmHg at the maximum working temperature limit of 290° C. at the time of a soldering, which is slightly more than 7.6 mmHg, 1/100 of the atmospheric pressure (760 mmHg). From this result, it was found that the use in a soldering of auxiliary connecting materials which have a vapor pressure equivalent to 1/100 of the external pressure contributes to making electrical and mechanical joints securely.

Hydrocarbons generally used as auxiliary connecting materials are commercially available often in a form of mixture with the alkanes listed in Table 1. It is time and cost consuming to purely refine an item of alkane. Mixtures having the temperature-vapor pressure characteristic curves within the region (T1, T2, P2 and P1) indicated in the above-mentioned FIG. 4B can be used as auxiliary connecting materials 4 if they are hydrocarbons having as a whole the temperature-vapor pressure characteristic curves which fall within the compatible range, even in the case, for instance, of them containing hexane or pentatriacontane which did not fall within the compatible range for the eutectic solder in FIG. 4A.

Furthermore, hexane ($C_6H_{14}$) and pentatriacontane ($C_{35}H_{72}$) are effective as auxiliary connecting materials if they have a specified vapor pressure at a soldering temperature when a low temperature solder or a high temperature solder is used. Accordingly, although those two items of alkanes cannot be used for eutectic solder, hexane ($C_6H_{14}$) may be used for a low temperature solder and pentatriacontane ($C_{35}H_{72}$) for a high temperature solder.

Furthermore, in the above-mentioned embodiment, the auxiliary connecting material 4 may be applied to the region of the surface on the substrate between the terminals. The auxiliary connecting material 4 may be in a state of hydrocarbon as it is, or in a state of hydrocarbon as dissolved in solvent. The auxiliary connecting material 4 is applied by means of such as a normal brush.

In the embodiment mentioned above, the copper terminals 1 and 2 were taken up for connection surfaces with the solder 3 loaded on both surfaces. However, gold (Au) may be used as a material for connecting terminals. Effect of this invention remains the same if the solder 3 is loaded on one side only. Although in the case of the solder 3 being loaded on one side only, the connection is to be made not with the solder 3, but with a metal terminal, effect of this invention remains the same as far as generally used metal terminals are concerned.

(Second embodiment)

Figure 5:
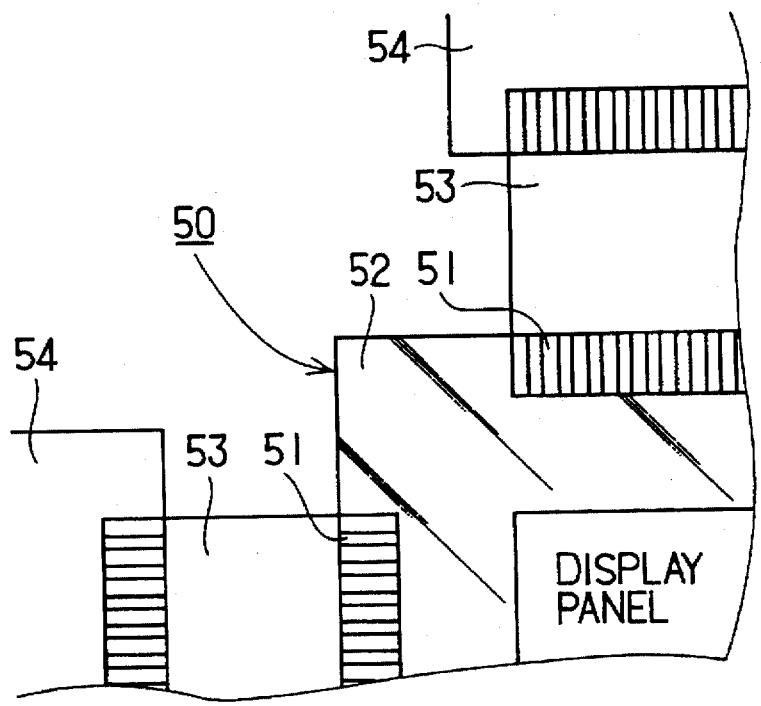
FIG. 5 is a plane view showing the outlet terminals of a flat panel display (EL display) according to a second embodiment.

FIG. 5 is a schematic diagram of a case in which this invention is applied to an outlet terminal 51 on a plane display panel of an EL display or a liquid crystal display. A description shall be given on an EL display 50. The EL display 50 is a display illuminated when voltage is applied to a luminous layer formed on a glass substrate 52. The voltage is applied by electrodes disposed in a matrix configuration. The EL display 50 has terminals, that is, the outlet terminals 51, for applying voltage from outside to electrodes disposed in a matrix configuration, which are formed around the periphery of the glass substrate 52 in a numerous microscopic array. This outlet terminal 51 is electrically connected to a control substrate 54, an external circuit, through a flexible substrate (FPC) 53.

As in the case of the first embodiment, soldering was performed to the outlet terminal 51 by using n-tetradecane. The result of the soldering is the same as shown in the sectional structure in the above-mentioned FIGS. 3A and 3B, having the same effect and realizing joints of high reliability. Since n-tetradecane is an insulating material, insulation is retained between the outlet terminals. It is also humidity-resistant preventing moisture from penetrating between the electrodes. Furthermore, existence as residue of high polymer molecule between the electrodes is effective in having the substrates connected each other and restrains the solder being separated from the electrodes.

Since the outlet terminals 51 form numerous electrodes at microscopic intervals, it is important to enhance the reliability of soldering. Thus, this invention is applied so that individual outlet terminals 51 can be soldered securely.

When disposing the outlet terminals 51 on the EL display 50 at narrow intervals, it is important for them to be securely soldered so that there will not occur a short-circuit between two adjoining outlet terminals during a soldering operation. The inventors of this invention succeeded in preventing the short-circuit in question by forming on the terminal 51 a solder fillet 8 shown in FIG. 2. Faulty soldering that could occur with the conventional flux was restrained from occurring by means of the soldering method of this invention. Furthermore, it eliminated the need of a cleaning process after soldering, thereby contributing to reducing the production time. Particularly, since the luminous layer of the EL display 50 is often deteriorated due to moisture, a substantial benefit can be brought about by the elimination of a cleaning process after soldering.

In view of the above, the connecting method of this invention is suitable for use in laying out wires at microscopic intervals. On this account, this invention has a wide range of application, being able to be used not only for a plane display panel but also for soldering substrates with one another which have terminals formed on them spaced at microscopic intervals. By using the connecting method of this invention, reliable joints can be achieved electrically and mechanically between the control substrate 54 and the flexible substrate 53.

(Third Embodiment)

Figure 6:
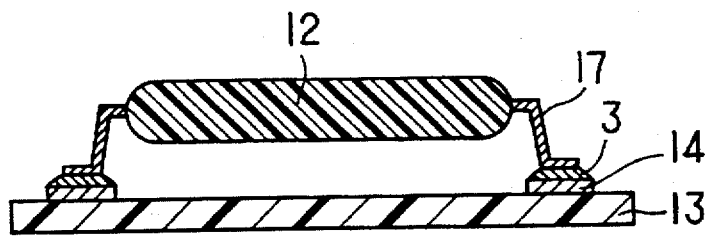
FIG. 6 is a schematic sectional view showing the configuration of a third embodiment.

FIG. 6 is a typical sectional view showing the connection structure between a circuit substrate 13 and a QFP (Quad Flat Package) type flat package 12 having an integrated circuit inside the package made up of resin material, with leads 17 coming from the four sides thereof.

On the circuit substrate 13 are provided connecting terminals 14 at a pitch of 0.6 mm. The connecting terminals 14 are plated with eutectic solder of a composition of Sn 60 wt %-Pb 40 wt %. They are further coated with flux as an auxiliary connecting material, which is composed of abietic acid 10 wt %, adipic acid 0.05 wt %, n-tetradecane 10 wt % and the rest of organic solvent (not shown in the figure). The lead 17 of the flat package 12 is provided at a pitch of 0.6 mm. After mounting the flat package 12 on the circuit substrate 13 so that the lead 17 is located on the connecting terminal 14, the lead 17 is heated by means of a heater bar up to 220° to 290° C., the solder 3 is re-flowed and preferably pressurized up to 2 to 40 kg/cm$^2$, and the lead 17 is electrically and mechanically connected to the connecting terminal 14.

By connecting the lead 17 to the connecting terminal 14 in this method, when the solder 3 is re-flowed, the n-tetradecane ($C_{14}H_{30}$) in the above-mentioned flux boils at the temperature that the solder 3 is fused and abruptly develops into cubical expansion. Through the boiling of the flux with it interposed between the solder 3 and the lead 17, an oxide film formed on the surface of the solder 3 is physically destroyed, and the adipic acid as an activator acts on the oxide films on the surfaces of the solder 3 and the lead 17 to chemically remove them, thereby enabling an electrical and mechanical joint of the lead 17 to the connecting terminal 14 to be performed securely. Since the boiling of n-tetradecane is utilized, the quantity of an activator such as adipic acid used for chemically removing an oxide film can be substantially reduced (0.05 wt % in this embodiment), allowing excellent insulating quality to be achieved in the mounting of components.

By the way, since the remains as residue of activator can cause a faulty insulation, it has had to be removed in the past by cleaning after soldering. However, this embodiment has an advantage that the cleaning operation can be dispensed with because of a substantially reduced activator.

Furthermore, the connection structure stated above is also excellent in moisture resistance as shall be described later. A moisture resistance test was conducted by applying a voltage of 14 V between the leads 17 adjoining side by side on the flat package 12, which were mounted but not cleaned, and they were left standing in an atmosphere of 65° C. and 95% RH for a test period of 500 hours, revealing a result that the incidence of failure was 0%. Consequently, application of the above-mentioned flux to connect the flat package 12 to the circuit substrate 13 contributes to making a connection structure which is excellent in moisture resistance.

The composition of the flux is not necessarily limited to the one mentioned above. For instance, abietic acid may be in a range of 0 to 10wt %, adipic acid and n-tetradecane may be in a range of 0 to 0.05 wt % and 1 to 10 wt % respectively.

(Fourth Embodiment)

Figure 7:
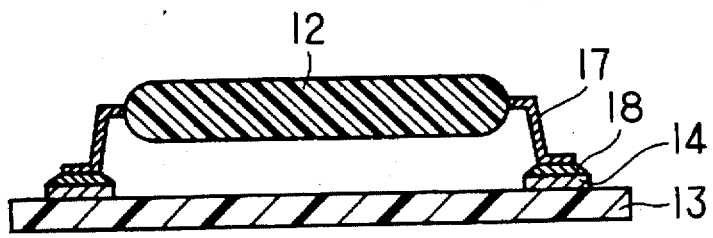
FIG. 7 is a schematic sectional view showing the configuration of a fourth embodiment.

FIG. 7 is a typical sectional view showing the structure of the fourth embodiment. The feature of this embodiment is that soldering paste 18 is applied on a connecting terminal 14 of a circuit substrate 13, and the soldering paste 18 is re-flowed to connect the connecting terminal 14 to a lead 17, with the other aspects of the structure being the same as in the case of the third embodiment.

The soldering paste 18 is a kneaded mixture of 90 wt % of soldering powder of 20 μm in diameter, 9.95 wt % of n-tetradecane ($C_{14}H_{30}$) and 0.05 wt % of adipic acid. The soldering paste 18 is printed and applied on the connecting terminal 14, and a flat package 12 is mounted on the circuit substrate 13 so that the lead 17 is located on the connecting terminal 14. Then, the lead 17 is heated up to a specified temperature by means of a heater bar to cause the soldering paste 18 to re-flow and get pressurized at a specified pressure, thereby connecting the lead 17 to the connecting terminal 14 electrically and mechanically.

Like this, by connecting the flat package 12 using the soldering paste 18, an equivalent effect as in the case of the third embodiment can be attained. The use of the soldering paste 18 has an advantage that it allows the lead 17 of the flat package 12 to be temporarily fixed in a paste state.

The composition of the soldering paste 18 is not necessarily limited to the one mentioned above. For instance, the soldering powder may be within a range of 90 to 95 wt % at 10 to 150 μm in diameter. Also, n-tetradecane and adipic acid may be within a range of 4 to 9.95 wt % and 0 to 0.05 wt % respectively. This invention does not impose any restriction on the composition thereof.

(Fifth Embodiment)

Figure 8A:
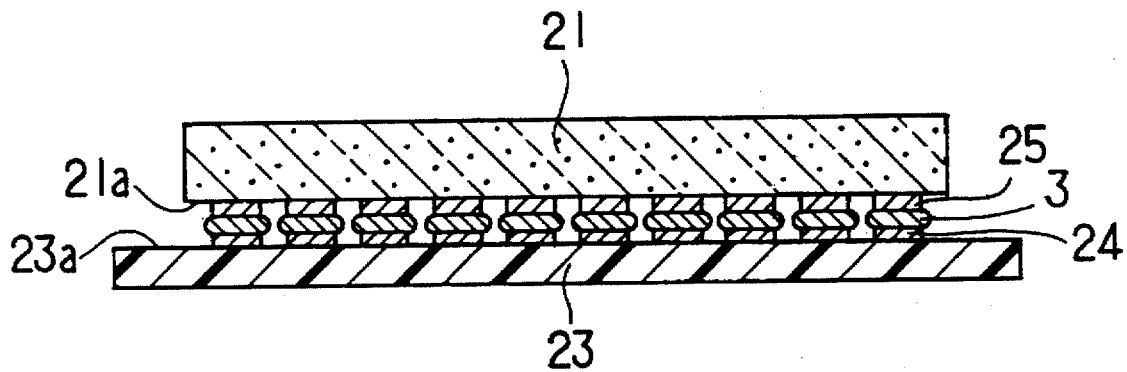
FIGS. 8A and 8B are a schematic sectional view and a perspective view, respectively, showing the configuration of a fifth embodiment.
Figure 8B:
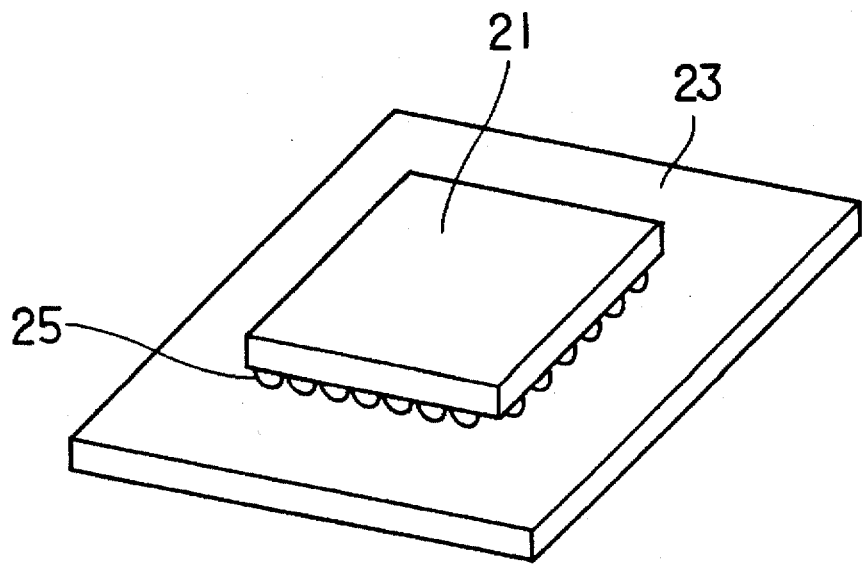

FIGS. 8A and 8B are a typical sectional view and a perspective view, respectively, showing the structure of the fourth embodiment. The feature of this embodiment is that an IC bare chip 21 with its silicon surface exposed and a circuit substrate 23 are electrically and mechanically connected.

On the upper surface 23a of the circuit substrate 23 are provided a plurality of connecting terminals 24 at specified intervals, and on the lower surface 21a of the IC bare chip 21 are provided a plurality of connecting terminals 25 at the same intervals as for the connecting terminals 24. The connecting terminals 24 and 25 are plated with eutectic solder 3 composed of 60 wt % of Sn and 40 wt % of Pb, and also coated with auxiliary connecting materials (not shown) such as n-tetradecane indicated in the first to third embodiments. Then, the IC bare chip 21 is mounted on the circuit substrate 23 so that the connecting terminals 25 are located on the connecting terminals 24, heated to cause solder 3 to re-flow and get pressurized at a specified pressure, thereby connecting the connecting terminals 24 to the connecting terminals 25. Like this, by connecting the IC bare chip 21, an equivalent effect as in the case of the first to third embodiments can be attained.

The process has a merit that it can dispense with a cleaning operation after soldering, and eliminate the problems in the past that ion impurities are left on bare chips with exposed silicon (Ion impurities remaining on bare chips cause trouble such as short-circuits due to ion migration).

This embodiment is so configured that the IC bare chip is connected to the circuit substrate 23 by using the solder 3 and the auxiliary connecting material. The configuration may also be such that soldering paste 18 is used to achieve a connection as shown in the fourth embodiment.

(Sixth embodiment)

Figure 9A:
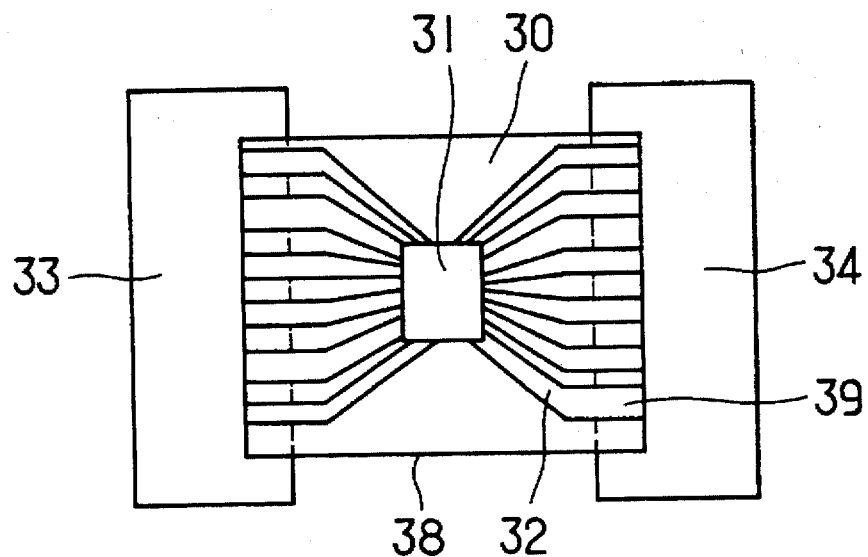
FIGS. 9A and 9B are schematic plane views showing the configuration of a sixth embodiment.
Figure 9B:
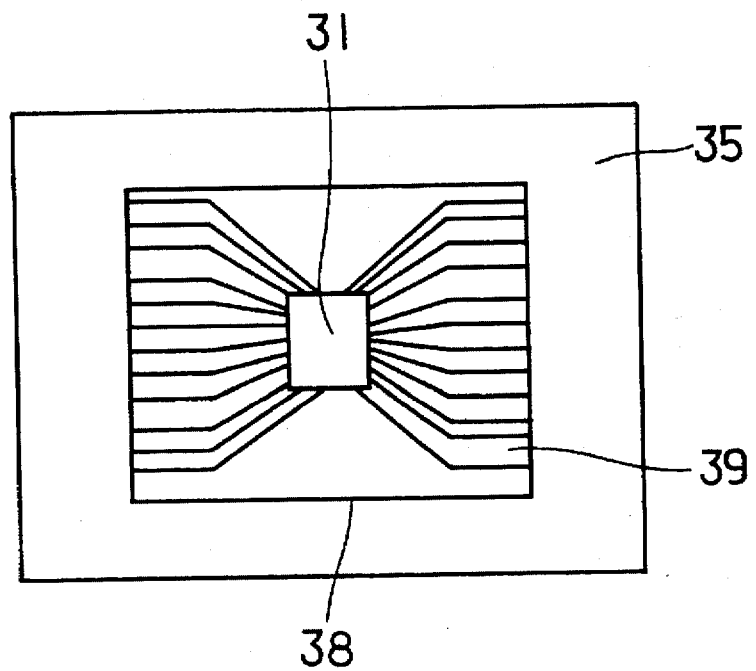

FIGS. 9A and 9B are typical plane views showing the configuration of the sixth embodiment. The feature of this embodiment is that a tape carrier package 38 and circuit substrates 33~35 are electrically and mechanically connected.

The tape carrier package 38 is configured with a insulating carrier tape 30, an IC chip 31 which is disposed almost at the center thereof, connecting terminals 39 which are provided at specified intervals at both sides of the carrier tape 30, and leads 32 which electrically connects the IC chip 31 to the connecting terminals 39. Furthermore, the circuit substrates 33~35 each have connecting terminals (not shown) provided at the same intervals as the connecting terminals 39. The connecting terminals 39 and the connecting terminals of the circuit substrates 33~35 are plated with eutectic solder composed of 60 wt % of Sn and 40wt % of Pb (not shown), and also coated with an auxiliary connecting material (not shown) such as n-tetradecane as in the case of the fifth embodiment.

In this configuration, the tape carrier package 38 is mounted so that the connecting terminals 39 are located on the connecting terminals of the circuit substrates 33 and 34, heated up to a specified temperature to cause the solder to re-flow, and get pressurized at a specified pressure, thereby connecting the connecting terminals 39 to the connecting terminals of the circuit substrates 33 and 34. In this way, as shown in FIG. 9A, the connection is executed with both ends of the tape carrier package 38 supported by the circuit substrates 33 and 34. The connecting terminals 39 and the connecting terminals of the circuit substrates 33 and 34 are well connected, and an equivalent effect as in the first to third embodiments can be attained. In addition, as shown in FIG. 9B, the configuration may be such that a connection is executed with the tape carrier package 38 supported by the entire surface of the circuit substrate 35.

In this embodiment, it is so configured that the tape carrier package 38 and the circuit substrates 33~35 are connected by using solder and an auxiliary connecting material. It may, however, be so configured that the tape carrier package 38 and the circuit substrates 33~35 are connected by using the soldering paste 18 of a composition indicated in the fourth embodiment.

By the way, besides eutectic solder of tin and lead, solders of tin and zinc, tin and silver, tin and antimony, cadmium and zinc, lead and copper, zinc and aluminum as well as cadmium and silver may also be used. For brazing materials, brazers of magnesium, aluminum, silver, phosphorus and copper, copper and brass, nickel, gold, palladium as well as cobalt may be used.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A soldering method comprising the steps of:
   disposing a main connecting material composed of a soldering or brazing material and an auxiliary connecting material of an insulating material between a base member and a connected member; and
   heat treating said main connecting material to be fused while at the same time causing said auxiliary connecting material to be cubically expanded or vaporized so that an oxide film grown on a surface of said main connecting material is destroyed, whereby said base member and said connected member are electrically and mechanically connected by means of said main connecting material.

2. A soldering method according to claim 1, wherein said disposing step includes the steps of:
   coating at least one of a first connection surface of a first connection part provided on said base member and a second connection surface of a second connection part provided on said connected member with said main connecting material;
   selecting as said auxiliary connecting material a material capable of vaporizing around at the melting point of said main connecting material so as to cause said auxiliary connecting material to be vaporized to destroy said oxide film during said heat treating step; and
   disposing said auxiliary connecting material between said coated main connecting material and the other surface opposite to said one coated with said main connecting material.

3. A soldering method according to claim 1, wherein said disposing step includes the steps of:
   coating at least one of a first connection surface of a first connection part provided on said base member and a second connection surface of a second connection part provided on said connected member with said main connecting material;
   selecting as said auxiliary connecting material a material mainly composed of such material whose boiling point is greater than the melting point of said main connecting material and whose vapor pressure is $1/100$ or over of the external pressure at a maximum temperature during said heat treating step so as to cause said auxiliary connecting material to be cubically expanded to destroy said oxide film during said heat treating step;
   applying said auxiliary connecting material at least to said one of said first and second connection surfaces; and
   placing said base member and said connected member so that said first connection surface and said second connection surface face each other.

4. A soldering method according to claim 1, wherein said disposing step includes the steps of:
   kneading said main connecting material and said auxiliary connecting material to form a paste;

applying said paste at least to one of a first connection surface of a first connection part provided on said base member and a second connection surface of a second connection part provided on said connected member; and placing said base member and said connected member so that said first connection surface and said second connection surface face each other.

5. A soldering method according to any one of claims 1 through 4, wherein said auxiliary connecting material is an insulating material free from functional groups.

6. A soldering method according to any one of claims 1 through 4, wherein said auxiliary connecting material comprises hydrocarbon.

7. A soldering method according to claim 6, wherein said hydrocarbon is one selected from the group consisting of alkane, alkene and alkyne.

8. A soldering method according to claim 5, wherein said auxiliary connecting material comprises hydrocarbon.

9. A soldering method according to claim 8, wherein said hydrocarbon is one selected from the group consisting of alkane, alkene and alkyne.

10. A soldering method according to any one of claims 2 through 4, wherein said first connection surface and said second connection surface have widths different from each other.

* * * * *